(12) United States Patent
Huhtasalo et al.

(10) Patent No.: US 11,544,515 B2
(45) Date of Patent: Jan. 3, 2023

(54) METHOD AND AN APPARATUS FOR PRODUCING A RADIO-FREQUENCY IDENTIFICATION TRANSPONDER

(71) Applicant: Digital Tags Finland, OY, Tampere (FI)

(72) Inventors: Lauri Huhtasalo, Tampere (FI); Juha Maijala, Espoo (FI)

(73) Assignee: Digital Tags Finland, OY, Tampere (FI)

( * ) Notice: Subject to any disclaimer, the term of this patent is extended or adjusted under 35 U.S.C. 154(b) by 248 days.

(21) Appl. No.: 16/755,398

(22) PCT Filed: Oct. 9, 2018

(86) PCT No.: PCT/IB2018/057813
§ 371 (c)(1),
(2) Date: Apr. 10, 2020

(87) PCT Pub. No.: WO2019/073381
PCT Pub. Date: Apr. 18, 2019

(65) Prior Publication Data
US 2020/0242440 A1    Jul. 30, 2020

(30) Foreign Application Priority Data
Oct. 13, 2017    (SE) .................................. 1751266-6

(51) Int. Cl.
*H05K 1/11*    (2006.01)
*G06K 19/077*    (2006.01)
(Continued)

(52) U.S. Cl.
CPC ...... *G06K 19/07718* (2013.01); *B23K 1/0016* (2013.01); *B65H 18/103* (2013.01);
(Continued)

(58) Field of Classification Search
CPC .............. H05K 1/11; H05K 1/14; H05K 1/18; H05K 1/111; H05K 1/141–144;
(Continued)

(56) References Cited

U.S. PATENT DOCUMENTS 6,027,027 A    2/2000  Smithhall
7,214,569 B2 *  5/2007  Swindlehurst .......... H01L 24/19
                                                        438/665
(Continued)

FOREIGN PATENT DOCUMENTS

DE    102006014437 A1    3/2007
EA        008748 B1    8/2007
RU      2563971 C2    9/2015

OTHER PUBLICATIONS

International Searching Authority, International Search Report, PCT/IB2018/057813, dated Jan. 3, 2019.

*Primary Examiner* — Tuan T Dinh
(74) *Attorney, Agent, or Firm* — Greer, Burns & Crain, Ltd.

(57) ABSTRACT

Method and apparatus for producing RFID transponders (400) arranged on a carrying substrate, comprising: providing a first substrate (100), the first substrate having at least one antenna element (101) arranged thereon, and preferably several antenna elements arranged sequentially thereon along a longitudinal extension of the first substrate, each antenna element being formed by an electrically conductive pattern; providing a second substrate (200), the second substrate (200) having at least one RFID strap, each RFID strap comprising an IC (202) and at least one contact pad (201) coupled to the IC, and preferably several RFID straps being arranged sequentially along a longitudinal extension of the second substrate; and electrically connecting an antenna element (101) on the first substrate to the at least one contact pad on the second substrate by bringing said first and
(Continued)

second substrates together, thereby bringing said antenna element in mechanical contact with said at least one contact pad, and heating the contact pad(s) to a temperature at least equal to a characteristic melting point of said at least contact pads, thereby electrically connecting the antenna element to said at least one contact pad.

26 Claims, 3 Drawing Sheets

(51) Int. Cl.
| | |
|---|---|
| *B23K 1/00* | (2006.01) |
| *B65H 18/10* | (2006.01) |
| *H05K 1/14* | (2006.01) |
| *H05K 1/18* | (2006.01) |
| *H05K 3/34* | (2006.01) |
| *H05K 3/36* | (2006.01) |
| *B23K 103/00* | (2006.01) |
| *B23K 101/36* | (2006.01) |

(52) U.S. Cl.
CPC ........ *G06K 19/07773* (2013.01); *H05K 1/111* (2013.01); *H05K 1/144* (2013.01); *H05K 1/181* (2013.01); *H05K 3/341* (2013.01); *H05K 3/36* (2013.01); *B23K 2101/36* (2018.08); *B23K 2103/38* (2018.08); *B23K 2103/40* (2018.08); *B23K 2103/42* (2018.08); *H05K 2201/10098* (2013.01)

(58) Field of Classification Search
CPC .... H05K 1/181–188; H05K 3/36; H05K 3/41; G06K 19/077; G06K 19/07718; G06K 19/07749

USPC ................ 361/736–737, 760, 764–767, 782; 29/601, 742–759, 832–834; 438/26, 438/61–64, 124, 127
See application file for complete search history.

(56) References Cited

U.S. PATENT DOCUMENTS

| | | | |
|---|---|---|---|
| 7,386,936 | B2 | 6/2008 | Huhtasalo et al. |
| 7,555,826 | B2* | 7/2009 | Armijo ............... H01L 23/5388 29/601 |
| 9,629,255 | B2 | 4/2017 | Maijala et al. |
| 9,792,543 | B2* | 10/2017 | Kuschewski .... G06K 19/07722 |
| 2003/0136503 | A1 | 6/2003 | Green et al. |
| 2004/0089408 | A1* | 5/2004 | Brod ................ G06K 19/07718 156/239 |
| 2006/0057763 | A1 | 3/2006 | Teo et al. |
| 2006/0057827 | A1* | 3/2006 | Huhtasalo ........ G06K 19/07779 438/584 |
| 2006/0118229 | A1 | 6/2006 | Ohashi et al. |
| 2007/0141760 | A1 | 6/2007 | Ferguson et al. |
| 2007/0238245 | A1 | 10/2007 | Cote et al. |
| 2007/0279230 | A1 | 12/2007 | Lakeman et al. |
| 2013/0291375 | A1 | 11/2013 | Virtanen et al. |
| 2015/0235121 | A1* | 8/2015 | Pavate ............. G06K 19/07783 235/492 |
| 2016/0056544 | A1* | 2/2016 | Garcia ................ H01Q 9/0407 343/725 |
| 2017/0038325 | A1* | 2/2017 | Takashima ......... G06K 19/0702 |

\* cited by examiner

METHOD AND AN APPARATUS FOR PRODUCING A RADIO-FREQUENCY IDENTIFICATION TRANSPONDER

This application is a U.S. National Stage under 35 U.S.C. § 371 of International Application No. PCT/IB2018/057813, filed Oct. 9, 2018, which claims priority to Swedish Patent Application No. 1751266-6, filed Oct. 13, 2017.

TECHNICAL FIELD OF THE INVENTION

The present invention is related to a roll-to-roll method for producing a radio-frequency identification (RFID) transponder arranged on a carrying substrate, and to an apparatus for producing such an RFID transponder.

BACKGROUND

In recent years, new methods of producing printed electronics have been developed, allowing forming of conductive electrical patterns on substrates such as paper and plastics, avoiding the problems of etching and the like used in silk screen printing of printed circuit boards (PCB). Such new methods are e.g. discussed in WO 2013/113995, WO 2016/189446, WO 2009/135985 and WO 2008/006941.

One common use of printed electronics is as integrated inserts in labels, e.g. in so-called smart labels or tags. A smart label/tag is a flat configured transponder, e.g. arranged under a conventional print-coded label, and includes a chip and an antenna. The labels/tags are often made of paper, fabric or plastics, and are normally prepared as a paper roll with the RFID inlays laminated between a rolled carrier and a label media for use in specially designed printer units. Smart labels offer advantages over conventional barcode labels, such as higher data capacity, possibility to read and/or write outside a direct line of sight, and the ability to read multiple labels or tags at one time.

It is also known to incorporate RFID labels directly in a packaging material, to form so-called intelligent packaging products.

However, despite the progress made in production of printed electronics, production of smart labels/tags/packages is still cumbersome and costly.

Conventional RFID/smart label production processes use separate equipment to produce RFID antennas, to assemble microchips onto the antennas and to convert the RFID inlays into an RFID label/tag format. In addition, depending on the configuration of the tag/label, some steps may be complicated and time-consuming, such as the connecting of the IC to an antenna, which generally requires very high precision. Similar problems are experienced in manufacturing of intelligent packaging products.

Thus, the overall process to form RFID transponders arranged on a carrying substrate, such as RFID labels/tags and intelligent packaging products, is today very costly, and requires a large number of separate equipment to produce antennas, inlays and the final label/package, resulting in large capital expenditure and floor space requirements. The many different steps used also makes the production difficult to control efficiently, and also leads to complicated production setups and handling. Further, large work-in-progress storages are needed, and the overall lead-time is long.

There is therefore a need for a method and apparatus for more efficient production of RFID transponders on carrying substrates. In particular, there is a need to simplify and/or speed up the connecting of the IC to the antenna.

SUMMARY

It is therefore an object of the present invention to provide a method and an apparatus for producing RFID transponders on carrying substrates, such as RFID tags or labels or intelligent packaging products, which at least partially address one or more of the above-mentioned needs.

This object is obtained by means of a method and a production system in accordance with the appended claims.

According to a first aspect of the present invention, there is provided a method for producing radio-frequency identification (RFID) transponders arranged on a carrying substrate, comprising:

providing a first substrate, the first substrate having at least one antenna element arranged thereon, and preferably several antenna elements arranged sequentially thereon along a longitudinal extension of the first substrate, each antenna element being formed by an electrically conductive pattern;

providing a second substrate, the second substrate having at least one RFID straps, each RFID strap comprising an integrated circuit (IC) and at least one contact pad coupled to the IC, and preferably several RFID straps being arranged sequentially along a longitudinal extension of the second substrate; and electrically connecting an antenna element on the first substrate to the at least one contact pad on the second substrate by
  bringing said first and second substrates together, thereby bringing said antenna element in mechanical contact with said at least one contact pad, and
  heating the contact pad(s) to a temperature at least equal to a characteristic melting point of said at least contact pads, thereby electrically connecting the antenna element to said at least one contact pad.

Electrically connecting the antenna element to the at least one contact pad results in the antenna element becoming electrically and operatively connected to the integrated circuit that is electrically connected to the contact pad. By "operatively connected" is here meant that the antenna element is operable as an antenna for the integrated circuit.

By the "characteristic melting point" is here meant the temperature at which the material in question begins to behave as a more or less viscous liquid. If the material starts to melt at a well-defined temperature, then that temperature is the characteristic melting point. If the material is a composite where two or more constituents remain separate in different particles and/or even within a single particle, the characteristic melting point is the temperature at which such a constituent melt that has a predominant effect on the creation of cohesion within the melt coming from a plurality of molten particles. If the conductive material is homogeneous in composition and consist only of one metal or alloy that has a well-defined melting temperature, the characteristic melting point is the melting temperature of that metal or alloy. The characteristic melting point should preferably be low enough so that the integrated circuit and the first and second substrates are not damaged during the heating. Typically, the characteristic melting point is less than 300° C., and preferably less than 200° C., for example in the range from 100° C. to 200° C.

The contact pads on the second substrate can be made of an alloy comprising tin and bismuth. Such materials can be melted and cured quickly and often have characteristic melting points that are particularly suitable for the present invention.

In accordance with one embodiment, the antenna elements are also made of a material having a melting point at or below said characteristic melting point. For example, the antenna elements can also be made of an alloy comprising tin and bismuth. Hereby, the soldering together of the contact pads and antenna elements becomes even quicker and easier.

Thus, the heating of the conductive material to a temperature exceeding a characteristic melting temperature of the conductive material results in a melting and solidification of the conductive material. This may in itself be sufficient to form the contact pad. However, the method may also comprise a step of applying a pressure onto the heated conductive material. This pressure is preferably applied relatively soon after the heating, so that the material still remains in a melted or almost melted state. Hereby, a good adhesion and good continuity of conductivity will be ensured.

It should be noted that the entire contact pad(s) is not necessarily heated to a temperature at least equal to the characteristic melting point. It may be that only a portion of the contact pad(s) is heated to such a temperature.

The present invention is based on the realization that the connecting of the antenna to the integrated circuit can be performed in a few simple and fast steps by combining a roll-to-roll technique with a heat-induced attachment process. A factor that contributes to the speed and simplicity of the method is that the step of operatively connecting the antenna to the IC can be performed with relatively low precision, acceptable tolerances typically being in the range of ±0.5 mm. By comparison, mounting the IC to the antenna using a pick-and-place machine must usually be done with very high precision, typically with tolerance requirements of about +/−50 microns.

The method is easy to integrate with many existing productions lines, especially production lines for producing packaging products because of the equipment typically used in such production lines. Further, since the RFID straps may now be connected to the antenna elements close to and just before application of labels/tags to e.g. a package, or in the formation of a product, the package or product producer obtains greater control of the process. Thus, the method and apparatus of the present invention can e.g. be arranged as an integral part of a packing line, converting line or even into die cutting units.

The connecting of the contact pads to the antenna elements in this way is also very fast. A connection in the time scale of ms can be achieved, such as in the range of 1-500 ms.

A further advantage of the present invention is that the RFID straps may be arranged very close to each other on the second substrate. This renders the production of such substrates comprising a plurality of RFID straps very fast and efficient. For example, the integrated circuits need only to be moved a very limited distance during assembly, e.g. with a pick-and-place equipment, and the pick-and-place arm need only to travel a very short distance. Also, the same RFID straps, and the same second substrates carrying such straps, may be used for many different applications, e.g. for use with different types of antennas, different RFID transponder products, etc. This makes production of the second substrates carrying the RFID straps more efficient, since only one or a few types may be used for a great variety of products and applications. Further, it enables a very efficient assembly process for producing the RFID transponders, where long runs of second substrates carrying the straps can be used without a need to stop and adjust the assembling apparatus for product-change-overs and the like.

Still further, the concept of the present invention allows very efficient separation of production steps, and thus enables more efficient use of manufacturing facilities and equipment. For example, the manufacturing of the second substrates carrying the RFID straps can be done far from the production of the actual labels, packages and the like. This can e.g. be made at electronics subcontractors, e.g. in Asia. Since the second substrates carrying the RFID straps can be made with very light weight, they are easy and cheap to ship even over long distances. The second substrates carrying the RFID straps may then be forwarded to packaging facilities and the like, where the antenna elements may be provided onto substrates for forming labels, packages and the like, e.g. by direct printing of the antenna elements, and where the RFID straps may be assembled with the antenna elements in the hereby disclosed way.

The first and second substrates may be provided in the forms of sheets and/or webs. In one line of embodiments, at least the second substrate is a web, and provided in the form of a roll of second substrate web.

In one embodiment, the first substrate is also a web, provided as a roll of first substrate web, and the method and arrangement is a roll-to roll process, in which input rolls are provided at one end and output rolls are received at the other. Hereby, the process is highly suitable for fully automated production. In such a process, the method/apparatus also preferably comprises re-winding of the assembled web on a third roll, in a re-winding station.

The roll-to-roll process is highly suitable for production of RFID transponders arranged on a carrying substrate forming RFID labels or RFID tags.

Alternatively, the first substrate may form a packaging material, and wherein the RFID transponders arranged on a carrying substrate forms a packaging blank for an intelligent packaging product. This can also be made in a roll-to-roll process, but may alternatively be made in a sheet-to-sheet process or in a roll-to-sheet process. Thus, for production of intelligent packaging products, the antenna elements may be provided directly on a package material, in the form of a sheet or a web, and the RFID straps may be connected to the antenna elements e.g. in a packaging converting facility. Hereby, packaging blanks for use as intelligent packages, and with integrated RFID transponders, can be produced in a very efficient way.

The heating may be applied be means of a contactless heating technique. Using such a technique helps to reduce the risk of the antenna element and/or the contact pads becoming smeared out. Also, such techniques typically allow for the heating step to be performed with relatively low precision, thus helping to make this step simple and fast.

The method may comprise pressing the heated antenna element and the at least one contact pad against each other. This may further strengthen the mechanical connection between the antenna element and the contact pad(s). The antenna element may be pressed against the contact pad(s) simultaneously and/or after the heating. The pressure may be applied by a nip. In case heating and pressing should occur simultaneously, the nip may have a surface temperature at or above the characteristic melting point. If pressure is applied after heating, as a separate step, the surface temperature of the nip is preferably lower than the characteristic melting point.

An adhesive may be arranged on at least one of the first and second substrates, the adhesive being arranged to adhere the first and second substrates together after the first and second substrates have been brought in mechanical contact. The adhesive helps to create a strong attachment between the first and second substrates. A lamination nip may also be used to apply pressure onto the assembled substrate, to provide an even better lamination.

At least one of the first and second substrates can be made of at least one of: paper, board, polymer film, textile and non-woven material. In particular, the substrates can be made of paper. Thereby, the RFID transponders become particularly suitable for attachment to objects made of paper materials, such as boxes for packaging.

The RFID transponders may be either passive, i.e. powered by a reader's electromagnetic field, or active, i.e. powered by an onboard battery.

The antenna elements may be produced in various ways. For example, the forming of the conductive pattern can be made by printing with conductive ink, such as silver ink, i.e. ink comprising conductive silver particles, or particles of carbon, copper, graphene, etc. The ink may also comprise two or more different materials, such as particles of different materials, or particles comprising two or more materials. In particular, the ink may comprise a material having a characteristic melting point being similar, identical or below the characteristic melting point of the contact pads. The solvent can be evaporated by means of heating at an elevated temperature, by use of photonic curing, or the like. The forming of the conductive pattern can also be made by first providing a conductive layer on the substrate, and the removing or forming this conductive layer into the desired conductive pattern, e.g. by means of grinding, cutting, or the like. This can e.g. be made in the way disclosed in EP 1 665 912 and WO 2005/027599, said documents hereby being incorporated in their entirety by reference.

In one embodiment, the forming of conductive material in a pattern comprise: transferring a conductive material in a pattern corresponding to said electrically conductive pattern to a surface of the face material substrate; and heating the conductive material to a temperature exceeding a characteristic melting temperature of the conductive material.

The conductive material is preferably in the form of electrically conductive solid particles. The transferring of conductive material to the face material substrate may e.g. comprise direct printing of electrically conductive particles as a part of a compound that contains, in addition of the electrically conductive solid particles, a fluid or gelatinous substance. However, the electrically conductive solid particles may also be in the form of dry powder. Further, an adhesive area may be created on the surface of the face material substrate prior to transfer of the particles.

The transfer of the conductive particles and the curing and solidification may in particular be made in the way disclosed in one or several of WO 2013/113995, WO 2009/135985, WO 2008/006941 and WO 2016/189446, all of said documents hereby being incorporated in their entirety by reference.

According to a second aspect of the present invention, there is provided an apparatus for producing a radio-frequency identification transponder arranged on a carrying substrate, comprising:

a first input station to receive a first substrate, the first substrate having at least one antenna element arranged thereon, and preferably several antenna elements arranged sequentially thereon along a longitudinal extension of the first substrate, each antenna element being formed by an electrically conductive pattern; and a second input station arranged to receive a second substrate, the second substrate having at least one RFID strap, each RFID strap comprising an integrated circuit (IC) and at least one contact pad coupled to the IC, and preferably several RFID straps being arranged sequentially along a longitudinal extension of the second substrate;

a transfer device configured to bring an antenna element on the first substrate in mechanical contact with the at least one contact pads on the second substrate;

a heating device configured to heat said contact pad(s) to a temperature at least equal to a characteristic melting point of said at least one contact pad, thereby electrically connecting said antenna element to said at least one contact pad.

The heating device may be configured to heat the contact pad(s) by a contactless heating technique.

The apparatus may comprise a pressing device, such as a nip, arranged to press the antenna element and the at least one contact pad against each other.

The apparatus may further comprise an adhesive applicator, arranged to provide an adhesive on at least one of the first and second substrates, the adhesive being arranged to adhere the first and second substrates together after the first and second substrates have been brought in mechanical contact.

In one embodiment the second substrate is a web, and wherein the second input station is arranged to receive a roll of second substrate web. The first substrate may also be a web, wherein the apparatus may be arranged to provide a roll-to-roll process, wherein the first substrate is received in the first input station as a roll of a first substrate web. The apparatus may further comprise a re-winding station for re-winding the assembled web on a third roll.

The RFID transponders may be arranged on a carrying substrate that forms RFID labels or RFID tags. The first substrate may alternatively form a packaging material, and wherein the RFID transponders arranged on a carrying substrate forms a packaging blank for an intelligent packaging product. In this case, the apparatus may form an integrated part of a packaging converting line.

It will be appreciated that the above-mentioned advantages of the method according to the first aspect of the present invention also hold for the apparatus according to the second aspect of the present invention.

These and other aspects of the invention will be apparent from and elucidated with reference to the embodiments described hereinafter.

BRIEF DESCRIPTION OF THE DRAWINGS

For exemplifying purposes, the invention will be described in closer detail in the following with reference to embodiments thereof illustrated in the attached drawings, wherein.

DETAILED DESCRIPTION OF PREFERRED EMBODIMENTS

Figure 1:
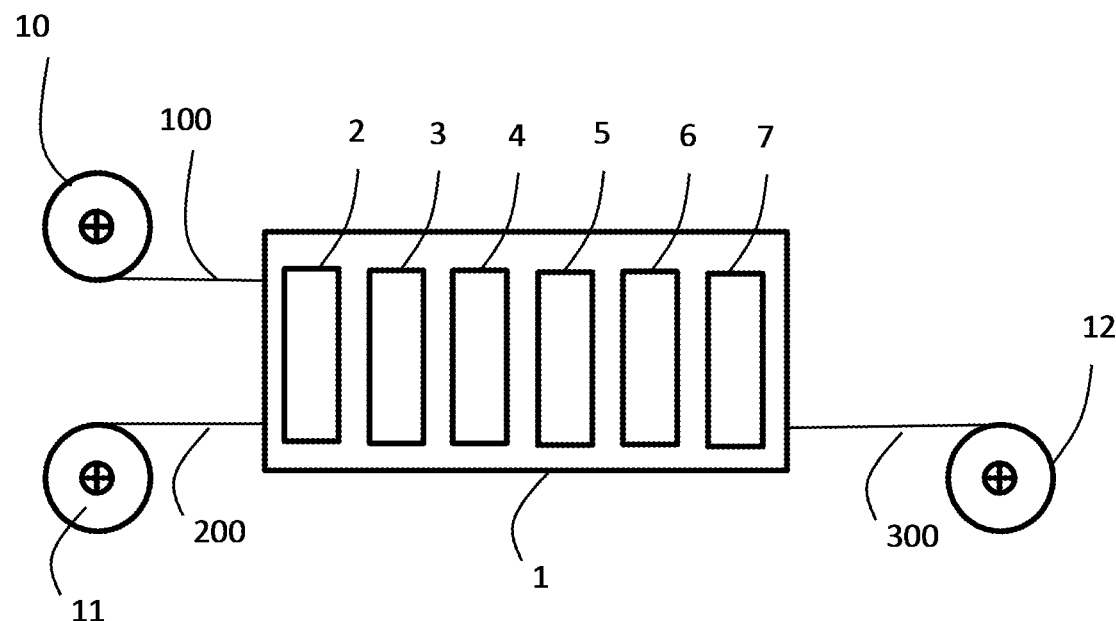
FIG. 1 schematically shows an apparatus for producing an RFID tag according to an example embodiment of the present invention.

In the following detailed description preferred embodiments of the invention will be described. However, it is to be understood that features of the different embodiments are exchangeable between the embodiments and may be combined in different ways, unless anything else is specifically indicated. It may also be noted that, for the sake of clarity, the dimensions of certain components illustrated in the drawings may differ from the corresponding dimensions in real-life implementations of the invention, such as the thickness of various layers, etc.

In the following, the invention will be exemplified in relation to a roll-to-roll process, where the substrates are provided in the form of webs arranged on rolls. However, it is to be appreciated by the skilled reader, that the process may also be used for substrates of other types, such as sheets. Thus, the process may also be embodied as a sheet-to-sheet process or a roll-to-sheet process.

Figure 2:
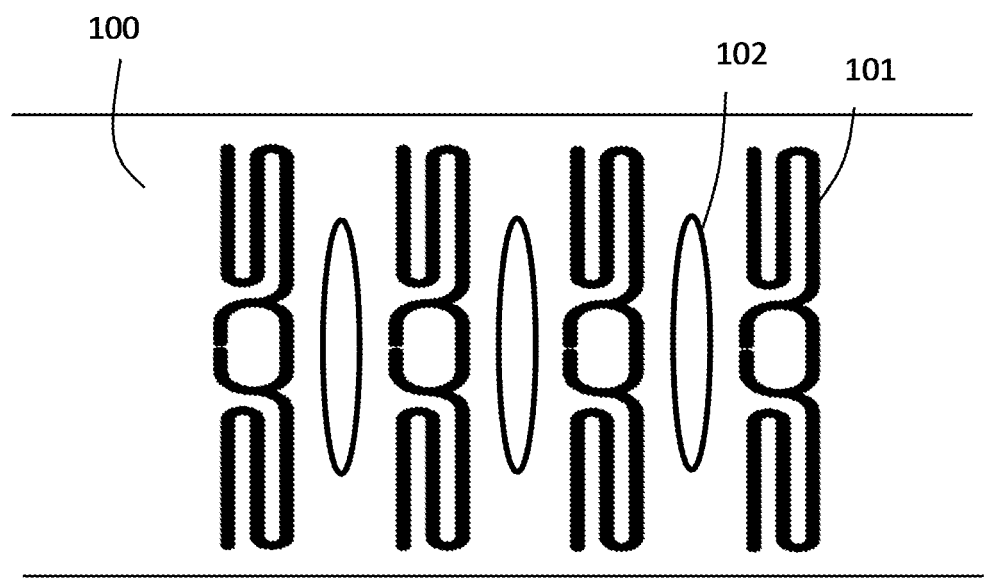
FIG. 2 schematically shows a substrate with antenna elements.
Figure 3:
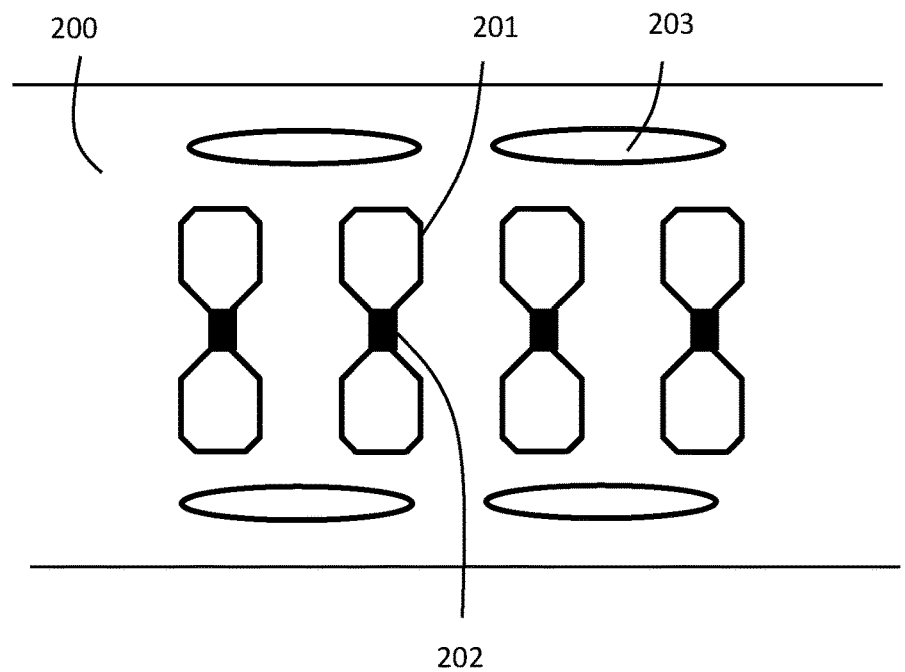
FIG. 3 schematically shows a substrate with integrated circuits and contact pads.

With reference to FIGS. 1 to 3, an apparatus 1 for producing an RFID transponder, such as an RFID tag or label, will now be described. The apparatus 1 may alternatively be referred to as an applicator. The apparatus 1 comprises an inlet 2 for receiving a first substrate, here in the form of a first web 100 and a second substrate, here in the form of a second web 200 which are provided in a first and second input station, on respective input rolls 10, 11. The input or unwind stations may be provided with reel holders for receiving the rolls 10, 11 of the webs. The substrates/webs are preferably fibrous substrates/webs, and can be of any of a wide variety of materials, widths and thicknesses. Paper and polymer films (plastics) are suitable, but other similar non-conductive surfaces may be also used. The substrates/webs may also be coated, and multilayered substrates/webs may also be used.

The first web 100 has antenna elements 101 arranged thereon. The antenna elements may e.g. be formed in a dipole antenna pattern. The antenna elements are arranged sequentially along the longitudinal extension of the web.

The second web 200 has RFID straps arranged thereon. Each RFID strap comprises at least one, and preferably at least two contact pads 201 and an integrated circuit (IC) 202 arranged thereon. The ICs 202 may alternatively be referred to as microchips or chips.

The first and second webs 100, 200 will be described in more detail below with reference to FIGS. 2 and 3.

The apparatus 1 may further comprise an adhesive applicator 3, to apply an adhesive onto on or both of the surfaces of the first and second webs that are facing each other. However, in some applications no adhesive is necessary, and if so the adhesive applicator may be omitted. Also, adhesive may already be provided on one or both of the webs on the rolls in the input stations. The adhesive may e.g. be a pressure sensitive adhesive (PSA) or a pressure sensitive hot melt adhesive, such as acrylic or hot-melt pressure-sensitive adhesive, cyanoacrylate, epoxy, polyurethane or any other adhesive type.

The apparatus 1 further comprises a transfer device 4 configured to bring an antenna element 101 in mechanical contact with one or more contact pads 201 on the second web 200. The transfer device 4 may for example comprise a nip with two adjacent rolls between which the first and second web 100, 200 are passed.

A heating device 5 is arranged to heat an antenna element 101 brought in mechanical contact with a contact pad 201. The heating device heats the contact pads to a temperature at least equal to, and preferably exceeding, the characteristic melting point for the contact pads. Hereby, the material in the contact pad is cured to form a solidified solder connection with the antenna element.

The heating is preferably a non-contacting heating, which reduces the risk of smearing or unwanted macroscopic changes in the spatial distribution of conductive material. However, heating methods that are contacting may also be used. Especially if heating is made with low or very low contact pressure, it may well have the same advantageous non-smearing characteristics. As a result of the heating, a melt is created.

Non-contacting heating may e.g. be obtained by infrared radiation, laser heating, or heating with other types of radiation, inductive heating, streaming with hot gas, etc. However, heating may also be made by bringing the substrate web or the conductive material into contact with a heated body, such as a heated nip.

The heating of the contact pads to a temperature exceeding a characteristic melting temperature of the conductive material therein results in a melting and solidification of the material. This may in itself be sufficient to form the solder connection, in particular if the heating also involves contacting with pressure.

However, the method may also comprise a step of applying a pressure onto the heated material, subsequent to the heating. This pressure may be applied by a pressing device 6, such as a nip, and preferably the surface temperature of the nip is lower than the characteristic melting temperature. This pressure is preferably applied relatively soon after the heating, so that the material still remains in a melted or almost melted state. Hereby, the pressure will cause the previously melted material to solidify without deformation.

The nip may be a non-heated nip. However, preferably, the nip is heated to a temperature only somewhat lower than the characteristic melting temperature, such as 30-60 degrees C. lower. This ensures for example that the melt will not solidify prematurely, before the contact pads become pressed against the antenna elements. The nip will cause the previously molten material of the originally solid contact pads to solidify again.

However, in other embodiments, the nip temperature may be equal or almost equal to the characteristic melting temperature of the used electrically conductive material.

Further, as already discussed, the pressing step may in some embodiments be omitted. Still further, other nips used in the process, e.g. a lamination nip, may be arranged to provide a pressure sufficient also for solidifying the melted contact pads, even without any additional pressing step.

The illustrated apparatus 1 may also, optionally, comprise a curing device 7. The curing device 7 is configured to cure the antenna element 201 after it has been heated by the heating device 5. The curing device 7 may also, or alternatively, be configured to cure the adhesive. In the illustrated example, the apparatus 1 also has an outlet 8 for releasing an output sheet, an assembled substrate, here an assembled web 300, which may be wound up on an output roll 12 in a re-wind station. The output sheet 300 is a substrate/web comprising a longitudinal sequence of RFID transponders.

It should be noted that some of the above-described components of the apparatus 1 may be integrated with each other. For example, the transfer device 4 may be integrated with the heating device 5 and/or the pressing device 6.

Further, an additional lamination nip (not shown) may be provided, for lamination of the two substrates/webs. The lamination nip may exert a pressure towards the webs, thereby effecting lamination. However, the lamination nip may also optionally be a heated nip, thereby also effecting lamination by additional heating. Also, lamination may be provided by the pressing device 6, in which case a separate lamination nip may be omitted.

After lamination, a die cutter or the like (not shown) may be provided in order to separate the transponders, e.g. in the form of labels/tags, from each other, and to provide the desired shape and dimensions of the transponders/labels. The die cutting station may e.g. be used to perforate the substrate/web, or completely cut through the substrate/web material along cutting lines. The die cutting station is preferably held in registration with the insertion stations so that the laminated label web may be cut without cutting through an electrically conductive pattern. The die cutting station may comprise cutting elements, e.g. in the form of one or more rotary die or other types of tooling for cutting or perforating used for forming labels or tags, or other forms of transponders carried by a carrying substrate. The die cutting station may also comprise a monitor or sensor to identify the location of the electrically conductive pattern, to ensure that cutting does not occur over the electrically conductive patterns.

Further, a waste matrix removal station (not shown) may be provided, and the removed matrix may be rolled onto a waste roll.

The transponders, in particular when in the form of labels/tags, may also be provided with an additional layer of adhesive on an outer surface, useable to adhere the label to packages, containers and the like. In that case, the labels may further comprise an easily removable release liner to cover the adhesive.

The labels may further comprise printed information, in the form of text, digits, bar codes, etc. To this end, the system may further comprise a printing station, e.g. for printing the face material web. The printing station (not shown) can e.g. be arrange at essentially any location along the production line. However, one or both of the webs received on the rolls may also comprise pre-printed label stock. The printing can be made by flexographic printing, off-set printing or any other printing method.

The re-winding station may also comprise post-processing means that are configured to post-process the final web, for example by cooling, removing static electric charge, coating, evaporation of volatile components of substances present within or on the web, or the like.

One or more tensioning devices (not shown) may also be provided along the production line, to control the tension of the webs, as is per se known in the art.

Further, a programming and/or testing station (not shown) may also be provided, and preferably arranged after the connection of the RFID straps to the antenna elements. At the programming and/or testing station, the RFID transponders may be programmed, in case they are not already preprogrammed, and the function of each RFID transponder may be tested and verified. The programming and/or testing station may comprise an interrogator system comprising an RFID antenna or multiple antenna arrays for checking and testing the functionality of each RFID transponder. More specifically, the station may comprise an RFID reader or an RFID reader/writer.

Now, turning to FIG. 2, it can be seen that the first substrate, here in the form of a first web 100, has the form of an elongated sheet. The web is flexible and the thickness of the web may vary depending on the application.

The antenna elements 101 are arranged in sequence along the longitudinal extension of the first substrate/web 100. Each antenna element 101 is formed by an electrically conductive pattern. All of the antenna elements are preferably arranged on the same side of the first substrate/web 100. In order to avoid short-circuiting the antenna elements 101, the substrate/web 100 may be made of an electrically non-conductive material, for example a paper material or a plastic material. However, the first substrate/web 100 can alternatively have a multi-layered structure, where only the layer on which the antenna elements 101 are arranged is non-conductive.

In the illustrated example, the antenna elements 101 are printed on the first substrate/web 100. The antenna elements 101 can for example be printed using one of the methods disclosed in WO 2008/006941 A1 or WO 2013/113995 A1. All of the antenna elements 101 are typically, although not necessarily, made of the same material. Suitable materials for the antenna elements 101 include SnBi alloys and conductive inks, such as inks made of silver, carbon, copper or graphene.

Further, in the illustrated example, a first adhesive 102 is arranged on the first web 100. More precisely, the first adhesive 102 is arranged on the same side of the first web 100 as the antenna elements 101. The first adhesive 101 may for example be an acrylic or hot-melt pressure-sensitive adhesive, cyanoacrylate, epoxy or polyurethane. The first adhesive 102 is optional and may be omitted. Further, the shape and location of the adhesive areas in the illustrated example are only exemplary, and the adhesive may alternatively be applied to other areas as well, and may e.g. be arranged to cover essentially the entire web surface.

As shown in FIG. 3, the second substrate/web 200 has the form of an elongated sheet. The second substrate/web 200 is flexible and may have the same or a different thickness as the first substrate/web. The thickness of the second substrate/web may also vary depending on the application.

The RFID straps, including the ICs 202 and the contact pads 201, are arranged in sequence along the longitudinal extension of the second substrate/web 200. All of the ICs 202 and the contact pads 201 are preferably arranged on the same side of the second substrate/web 200. In order to avoid short-circuiting the ICs 202 and the contact pads 201, the second substrate/web 200 is typically made of an electrically non-conductive material, for example a paper material or a plastic material. However, the second substrate/web 200 can alternatively have a multi-layered structure, where only the layer on which the ICs 202 and the contact pads 201 are arranged is non-conductive.

In the illustrated example, each IC 202 is electrically connected to two contact pads 201. The two contact pads 201 are arranged on respective longitudinal sides of the IC 202.

Further, in the illustrated example, the contact pads 201 are printed on the second substrate/web 200. The contact pads 201 can for example be printed using one of the methods disclosed in WO 2008/006941 A1 or WO 2013/113995 A1. All of the contact pads 201 on the second substrate/web 200 are typically, although not necessarily, made of the same material. The contact pads have a characteristic melting point, the value of the characteristic melting point depending on the material of which the contact pads 201 are made. A characteristic melting point is preferably less than 300° C., and more preferably less than 200° C.

The contact pads may be of any metal, and may e.g. be of pure metal. However, the contact pads are preferably formed of alloys, and most preferably non-eutectic alloys. In particular, it is preferred to use metallic compounds that are—or resemble—so-called low temperature solders. The alloys preferably comprise tin and bismuth.

A non-limiting example list of such metallic compounds includes (indicated percentages are weight percentages):

- tin/silver (3.43 percent)/copper (0.83 percent)
- tin/silver (2-2.5 percent)/copper (0.8 percent)/antimony (0.5-0.6 percent)
- tin/silver (3.5 percent)/bismuth (3.0 percent)
- tin/zink (10 percent)
- tin/bismuth (35-58 percent)
- tin/indium (52 percent)
- bismuth (53-76 percent)/tin (22-35 percent)/indium (2-12 percent)
- tin (35-95 percent)/bismuth (5-65 percent)/indium (0-12 percent).

At room pressure, the first four listed examples melt between 180 and 220 degrees centigrade, while the four last-mentioned may melt at significantly lower temperatures, even below 100 degrees centigrade.

Preferably, the contact pads consist essentially of metal or metal alloy. The metal or metal alloy preferably has an atmospheric-pressure characteristic melting temperature of less than 300 degrees C., and more preferably less than 250 degrees C., and most preferably less than 200 degrees C., such as in the range 50-250° C., or preferably within the range 100-200° C., which makes the method suitable, for example, for conventional paper, the physical properties of which may permanently change at too high temperatures. Suitable metals include, e.g. tin, bismuth, indium, zinc, nickel, or similar, used as single metals or in combinations. For example, tin-bismuth, tin-bismuth-zinc, tin-bismuth-indium or tin-bismuth-zinc-indium in different ratios may be used. In tin-containing alloys, the ratio of tin in the alloy is preferably 20-90 wt-percent, and most preferably 30-70, wt-percent of the total weight of the components in the alloy.

Further, in the illustrated example, a second adhesive 203 is arranged on the second web 200. More precisely, the second adhesive 203 is arranged on the same side of the second web 200 as the ICs 202 and the contact pads 201. The second adhesive 203 may for example be an acrylic or hot-melt pressure-sensitive adhesive, cyanoacrylate, epoxy or polyurethane. The second adhesive 203 is optional and may be omitted.

Figure 4:
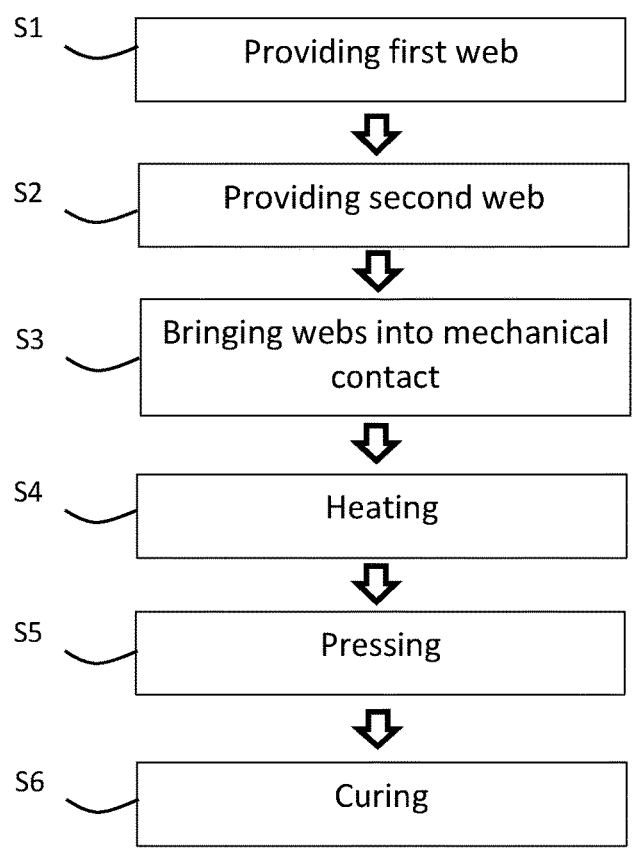
FIG. 4 is a flowchart of an method for producing an RFID tag; according to an example embodiment of the present invention.

With reference to FIG. 4, and with continued reference to FIGS. 1 to 3, some of the steps of a method for producing an RFID transponder, such as a tag, label or package, will now be described. First, at steps S1 and S2, the first and second webs 100, 200 are provided. The first and second webs 100, 200 may e.g. be provided in the form of the input rolls 10, 11.

Next, the apparatus 1 is used to electrically connect antenna elements 101 of the first web 100 and contact pads 201 on the second web 200 with each other. More specifically, the first and second webs 100, 200 are gradually unwound from the input rolls 10, 11 and guided to the transfer device 4 via the inlet 2. At step S3, the transfer device 4 brings an antenna element 101 of the first web 100 in mechanical contact with a contact pad 201 on the second web 200. At step S4, the heating device 5 heats the antenna element 101 to a temperature at least equal to the characteristic melting point of the contact pads 201. The heating step S4 usually takes very short time, in the order of ms. At step S5, the pressing device 6 press the heated antenna element 101 and the contact pad 201 against each other. At step S6, the heated antenna element 101 is cured by the curing device 7. After the curing in step S6, the antenna element 101 and the contact pad 201 are electrically and mechanically connected. By repeating the steps S3 to S6, it is possible to produce an output web in the form of a longitudinal sequence of RFID transponders. The output sheet may be wound up on the output roll 12. An RFID tag may be separated from the output sheet by cutting.

Figure 5:
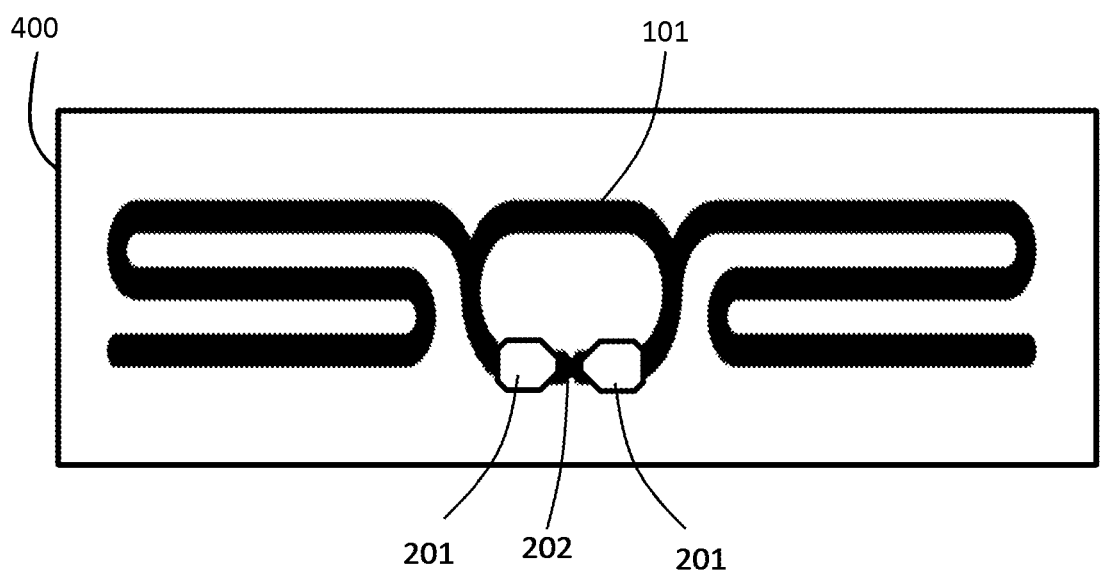
FIG. 5 schematically shows an RFID tag.

FIG. 5 shows an example of an RFID tag 400 which has been produced by the method discussed with reference to FIG. 4. The antenna element 101 of the RFID tag 400 is electrically and operatively connected to the IC 202 via the two contact pads 201 next to the IC 202.

The person skilled in the art realizes that the present invention is not limited to the above-described embodiments. For example, the apparatus 1 may be configured to test the RFID tags for defects, remove defected RFID tags and/or program the ICs. Further, it should be noted that some of the steps S1 to S6 may be performed simultaneously or in a different order than depicted in FIG. 4. The steps S4 and S5 may for example be performed simultaneous.

Such and other obvious modifications must be considered to be within the scope of the present invention, as it is defined by the appended claims. It should be noted that the above-described embodiments illustrate rather than limit the invention, and that those skilled in the art will be able to design many alternative embodiments without departing from the scope of the appended claims. In the claims, any reference signs placed between parentheses shall not be construed as limiting to the claim. The word "comprising" does not exclude the presence of other elements or steps than those listed in the claim. The word "a" or "an" preceding an element does not exclude the presence of a plurality of such elements.

The invention claimed is:

1. A method for producing radio-frequency identification (RFID) transponders) arranged on a carrying substrate, comprising:
   providing a first substrate, the first substrate having one or more antenna elements arranged sequentially thereon along a longitudinal extension of the first substrate, each antenna element being formed by an electrically conductive pattern;
   providing a second substrate, the second substrate having one or more RFID straps, each RFID strap comprising an integrated circuit (IC) and at least one contact pad coupled to the IC, and being arranged sequentially along a longitudinal extension of the second substrate; and
   electrically connecting antenna elements on the first substrate to contact pads on the second substrate by
   bringing said first and second substrates together, thereby bringing respective said antenna elements into mechanical contact with respective said contact pads,
   heating the contact pads to a temperature at least equal to a characteristic melting point of said contact pads, thereby electrically connecting the antenna elements to respective said contact pads, and
   pressing the one or more antenna elements and the one or more contact pads against each other, during or after said heating.

2. The method of claim 1, wherein said heating is provided using a contactless heating technique.

3. The method of claim 1, wherein an adhesive is arranged on at least one of the first and second substrates, the adhesive being arranged to adhere the first and second substrates together after the first and second substrates have been brought together.

4. The method of claim 1, wherein at least one of the first and second substrates are made of at least one of: paper, board, polymer film, textile and non-woven material.

5. The method of claim 1, wherein the one or more contact pads on the second substrate are made of an alloy comprising tin and bismuth.

6. The method of claim 1, wherein the characteristic melting point is less than 300° C.

7. The method of claim 1, wherein the second substrate is a web, and wherein the second substrate is provided in the form of a roll of second substrate web.

8. The method of claim 1, wherein the RFID transponders arranged on a carrying substrate forms RFID labels or RFID tags.

9. The method of claim 1, wherein the first substrate forms a packaging material, and wherein the RFID transponders arranged on a carrying substrate forms a packaging blank for an intelligent packaging product.

10. The method of claim 1, wherein the characteristic melting point is less than 200° C.

11. The method of claim 7, wherein the method is a roll-to-roll process, and wherein the first substrate is a web, the first substrate being provided as a roll of a first substrate web.

12. The method of claim 9, wherein the method forms an integrated part of a packaging converting process.

13. The method of claim 11, further comprising the step of re-winding the assembled web on a third roll.

14. An apparatus for producing a radio-frequency identification transponder on a carrying substrate, comprising:
a first input station to receive a first substrate, the first substrate having one or more antenna elements arranged sequentially thereon along a longitudinal extension of the first substrate, each antenna element being formed by an electrically conductive pattern; and
a second input station arranged to receive a second substrate, the second substrate having one or more RFID straps, each RFID strap comprising an integrated circuit (IC) and at least one contact pad coupled to the IC, and being arranged sequentially along a longitudinal extension of the second substrate;
a transfer device configured to bring respective antenna elements on the first substrate in mechanical contact with respective contact pads on the second substrate;
a heating device configured to heat said contact pads to a temperature at least equal to a characteristic melting point of the at least one contact pad coupled to the IC, thereby electrically connecting respective said antenna elements to respective contact pads; and,
a pressing device arranged to press respective antenna elements and respective contact pads against each other.

15. The apparatus of claim 14, wherein the heating device is configured to heat said contact pads by a contactless heating technique.

16. The apparatus of claim 14, wherein the pressure is applied by a nip, wherein the surface temperature of the nip is lower than said characteristic melting point.

17. The apparatus of claim 14, further comprising an adhesive applicator, arranged to provide an adhesive on at least one of the first and second substrates, the adhesive being arranged to adhere the first and second substrates together after the first and second substrates have been brought in mechanical contact.

18. The apparatus of claim 14, wherein at least one of the first and second substrates is/are made of at least one of: paper, board, polymer film, textile and non-woven material.

19. The apparatus of claim 14, wherein the contact pads on the second substrate are made of an alloy comprising tin and bismuth.

20. The apparatus according to claim 14, wherein the characteristic melting point is less than 300° C.

21. The apparatus of claim 14, wherein the second substrate is a web, and wherein the second input station is arranged to receive a roll of second substrate web.

22. The apparatus of claim 14, wherein the RFID transponders arranged on a carrying substrate forms RFID labels or RFID tags.

23. The apparatus of claim 14, wherein the first substrate forms a packaging material, and wherein the RFID transponders arranged on a carrying substrate forms a packaging blank for an intelligent packaging product.

24. The apparatus of claim 21, wherein the apparatus is arranged to provide a roll-to-roll process, and wherein the first substrate is a web, the first substrate being received in the first input station as a roll of a first substrate web.

25. The apparatus of claim 23, wherein the apparatus forms an integrated part of a packaging converting line.

26. The apparatus of claim 24, further comprising the re-winding station for re-winding the assembled web on a third roll.

* * * * *